(12) United States Patent
Stern

(10) Patent No.: US 7,050,919 B1
(45) Date of Patent: May 23, 2006

(54) METHOD AND APPARATUS FOR AUTOCALIBRATING A PLURALITY OF PHASE-DELAYED CLOCK SIGNAL EDGES WITHIN A REFERENCE CLOCK PERIOD

(75) Inventor: Kenneth Stern, Watertown, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/718,215

(22) Filed: Nov. 19, 2003

(51) Int. Cl.
*G06F 19/00* (2006.01)
*H03H 11/26* (2006.01)
*G01C 23/00* (2006.01)

(52) U.S. Cl. .................. 702/106; 324/158.1; 327/262; 341/122; 702/79

(58) Field of Classification Search .................. 702/72, 702/75, 76, 79, 104, 106, 107, 176; 324/76.39, 324/158.1; 327/146, 158, 262; 341/122
See application file for complete search history.

(56) References Cited

U.S. PATENT DOCUMENTS

| | | | |
|---|---|---|---|
| 5,438,259 A * | 8/1995 | Orihashi et al. ......... 324/158.1 |
| 5,488,369 A * | 1/1996 | Miller ........................ 341/122 |
| 6,242,959 B1 | 6/2001 | Stern ........................... 327/262 |
| 6,396,322 B1 * | 5/2002 | Kim et al. .................. 327/158 |

\* cited by examiner

*Primary Examiner*—John Barlow
*Assistant Examiner*—John Le
(74) *Attorney, Agent, or Firm*—Koppel, Patrick & Heybl

(57) ABSTRACT

A method for autocalibrating a plurality of phase-delayed clock signal edges within a reference clock period includes measuring delay spacing between the plurality of clock signal edges, calculating programmed delay spacing, calculating ideal signal edges from the programmed delay spacing and adjusting the clock signal edges to match the respective ideal signal edges. A plurality of calibrated clock signal edges is produced that are selectively available to a user.

12 Claims, 10 Drawing Sheets

METHOD AND APPARATUS FOR AUTOCALIBRATING A PLURALITY OF PHASE-DELAYED CLOCK SIGNAL EDGES WITHIN A REFERENCE CLOCK PERIOD

BACKGROUND OF THE INVENTION

1. Field of the Invention

This invention relates to reference timing circuits and, more particularly, to circuits for creating a linear time reference.

2. Description of the Related Art

Electrical circuits often require access to precise timing information for proper operation. In the automatic test equipment (ATE) industry, it is desirable to create a linear time reference that is capable of producing timing edges at predetermined intervals within one period of a reference clock. The timing edges are used by a pattern generator to create a sequence of data codes for drivers used to create a number of different edges (high, low, open) for a device under test (DUT).

One method to accomplish a linear program delay step over one full clock period P is to use an ideal voltage ramp to compare to a digital-to-analog (DAC) output. The comparison would switch from low to high or from high to low when the ramp voltage exceeds a programmed DAC output. A different delay may be chosen by programming the DAC to output a different voltage level for comparison with the ideal voltage ramp. One example implementation of this method is illustrated in U.S. Pat. No. 6,242,959. In this implementation, a ramp comparator circuit and DAC having a programmable delay are used to drive a one-shot circuit in a programmable delay circuit (PDC). Unfortunately, creating the highly linear ramp is difficult. Also, implementations using an ideal voltage ramp may have refire limitations that require a settling period after reset.

A need continues to exist, therefore, for a linear time reference that has fast refire.

SUMMARY OF THE INVENTION

A method for autocalibrating a plurality of phase-delayed clock signal edges within a reference clock period includes, in one embodiment of the invention, measuring delay spacing between the plurality of clock signal edges, calculating a programmed delay spacing, calculating ideal signal edges from the programmed delay spacing and adjusting the clock signal edges to match the respective ideal signal edges. This produces a plurality of calibrated clock signal edges that can be either highly linear or of a predetermined spacing, with fast refire and selective availability to a user.

An apparatus is described for measuring the time delay between adjacent clock edges that includes, in one embodiment of the invention, target and delay signal paths and a variable delay module in said delay signal path. The delay module has a delay bias input that is operable to delay a first clock signal through the delay module in response to receiving an input voltage so that, when first and second clock signals are introduced to the target and delay signal paths, respectively, the input voltage corresponds to the time delay between the first and second clock signals.

BRIEF DESCRIPTION OF THE DRAWINGS

The components in the figures are not necessarily to scale, emphasis instead being placed upon illustrating the principals of the invention. Moreover, in the figures, like reference numerals designate corresponding parts throughout the different views.

DETAILED DESCRIPTION OF THE INVENTION

A system and method for autocalibrating a plurality of phase-delayed clock signal edges within a reference clock period into a plurality of either nominally equal clock signal edges or clock signal edges that have a predetermined distribution includes measuring delay spacing between sequential clock signal edges, calculating a predetermined delay spacing from said delay spacing, calculating ideal signal edges from said programmed delay spacing and adjusting the clock signal edges to match the ideal signal edges so the plurality of clock signal edges are calibrated and selectively available to a user.

An apparatus for dividing a reference clock period into a plurality of nominally equally spaced clock signal edges includes first and second signal paths with a variable delay cell in the second signal path that has a delay bias input. The delay bias input is operable to delay a first clock signal through the variable delay cell in response to an input voltage so that, when first and second clock signals are introduced to the first and second signal paths, respectively, the measurement delay between the first and second clock signal is approximately zero.

Figure 1:
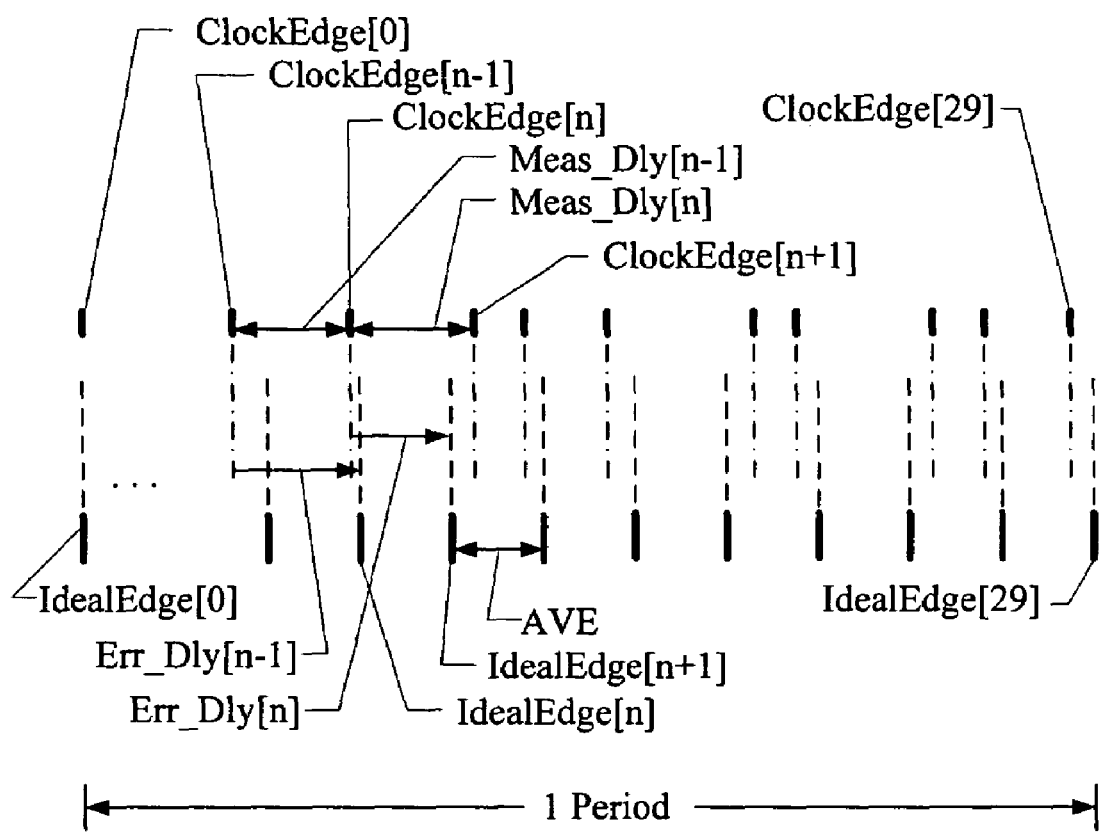
FIG. 1 is a timing diagram that illustrates, in one embodiment of the invention, delay spacing between clock signal edges and ideal signal edges.

In one embodiment, a multi-phase clock generator has plurality of timing outputs to provide a respective plurality of delayed clock signal edges ("clock edges") within one period P of a reference clock. FIG. 1 illustrates the clock edges in relation to calculated ideal signal edges ("Ideal Edges") that have an ideal time delay between them ("AVE") as calculated by the reference clock period P divided by the number of clocks N. A naming convention follows to facilitate description of the autocalibration of the clock edges. As illustrated in FIG. 1, the measured time delay between clock signal edges N−1 and N ("ClockEdge[n−1]"and "ClockEdge[n]", respectively) is Meas_Dly[n−1]. Similarly, the measured delay between ClockEdge[n] and the next adjacent clock signal edge ClockEdge[n+1] is Meas_Dly[n]. Thus, Meas_Dly[n−1] and Meas_Dly[n] represent time delays between actual clock edges.

The time delays between ClockEdge[n−1] and ClockEdge[n] and ideal signal edges N and N+1 (IdealEdge[N] and IdealEdge[n+1], respectively) are Err_Dly[n−1] and Err_Dly[n], respectively. Clock signal edge 1 ("ClockEdge[1]") and clock signal edge 29 ("ClockEdge[29]") are also illustrated to facilitate description of the methods and systems that follow. Although thirty clock-signal edges are illustrated, the number of edges is arbitrary and at the convenience of the designer of the system. To obtain similar time delays between clock edges but with fewer of them, a faster reference clock may be used. Also, fewer or more edges can be provided with proportionally fewer or more timing outputs provided by the multi-phase clock generator.

Figure 2:
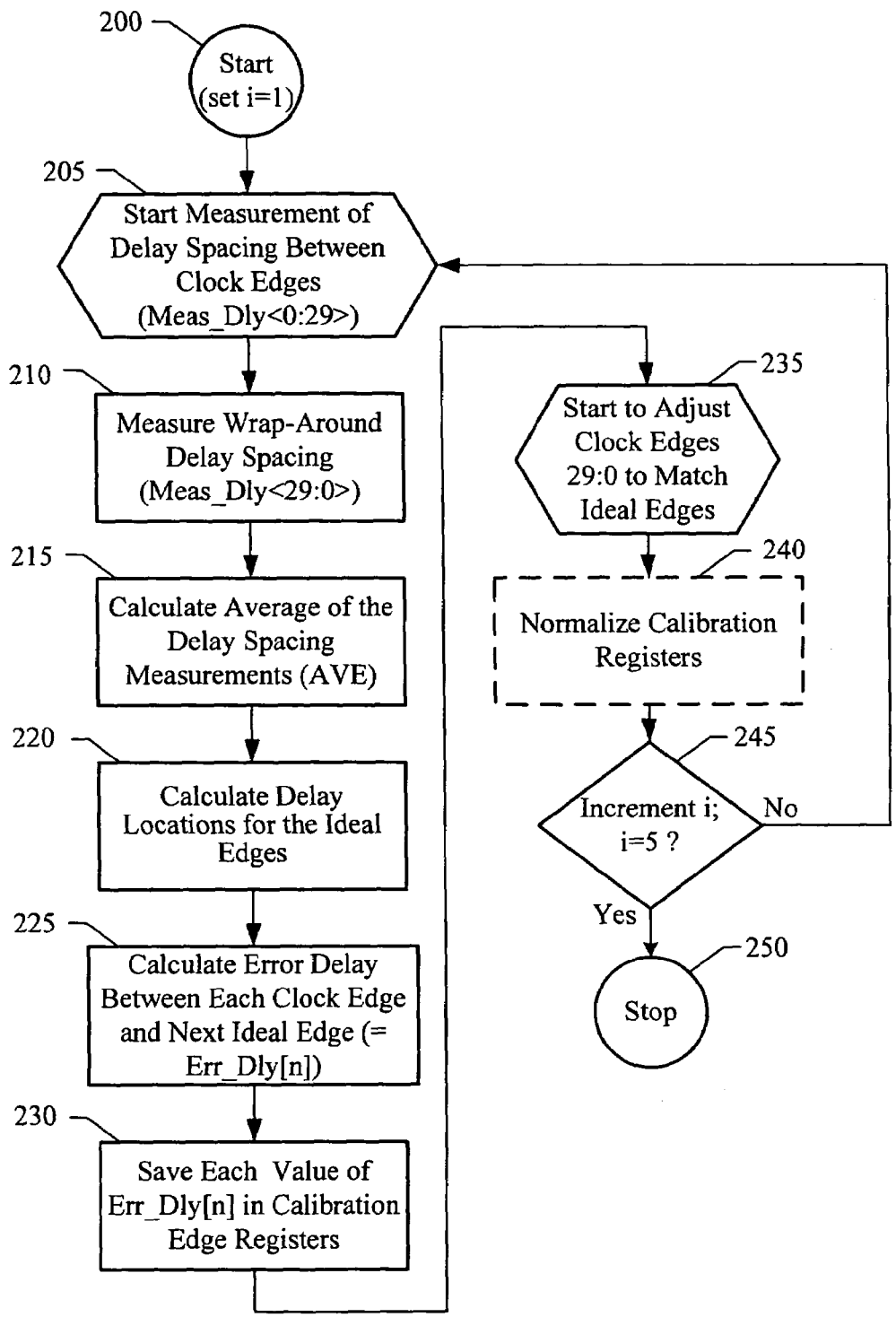
FIG. 2 is a flow diagram for adjusting a plurality of clock signal edges to match respective ideal clock signal edges.

FIG. 2 is a flow diagram of a method to adjust the clock signal edges illustrated in FIG. 1. In a system designed for thirty (30) clocks ("Clk[0–29]") generating thirty (30) clock-signal edges within a single period P, a counter is initialized (block 200) and the delay spacing between each adjacent clock signal edge is measured (Meas_Dly<0:29>) (block 205) (see FIG. 3). The wraparound delay spacing between ClockEdge29 and ClockEdge0 is also measured (block 210) to complete the measurement of thirty intervals. A predetermined delay spacing is calculated from the measured delay spacing, preferably the average of all delay spacing measurements AVE (block 215), and the value is used to calculate delay locations for the ideal edges (block 220). Or, a different delay spacing, such as a bell-shaped, sinusoidal or logarithmic delay spacing can be calculated to calculate delay locations for the ideal edges. If the average of all delay spacing measurements AVE is used, the error delay Err_Dly[n] between each clock edge and its associated next ideal edge is calculated (block 225) according to equation 1:

$$AVE-Meas\_Dly[n-1]+Err\_Dly[n-1]=Err\_Dly[n] \quad (1)$$

Each value of the error delay between respective clock and ideal edges is saved in either calibration edge registers or other memory locations (block 230) for later comparison to uncalibrated clock edges. Starting with ClockEdge29 and continuing down to ClockEdge0, each respective error delay value Err_Dly[29:0] is used to adjust the actual clock signal edges ClockEdge[29:0] to match the ideal signal edges IdealEdge[29:0] (block 235) (see FIG. 4). The calibration register values can be normalized to reduce non-linearities that may be induced by use of the outer ranges of calibration register values (block 240). The counter is incremented (block 245) and, if five iterations have not yet been completed, the process repeats (block 200) to reduce further non-idealities. Otherwise, the process is stopped (block 250). Although five iterations are illustrated, further iterations would produce a more linear division of the reference clock period and less iteration would result in less linearity.

Figure 3:
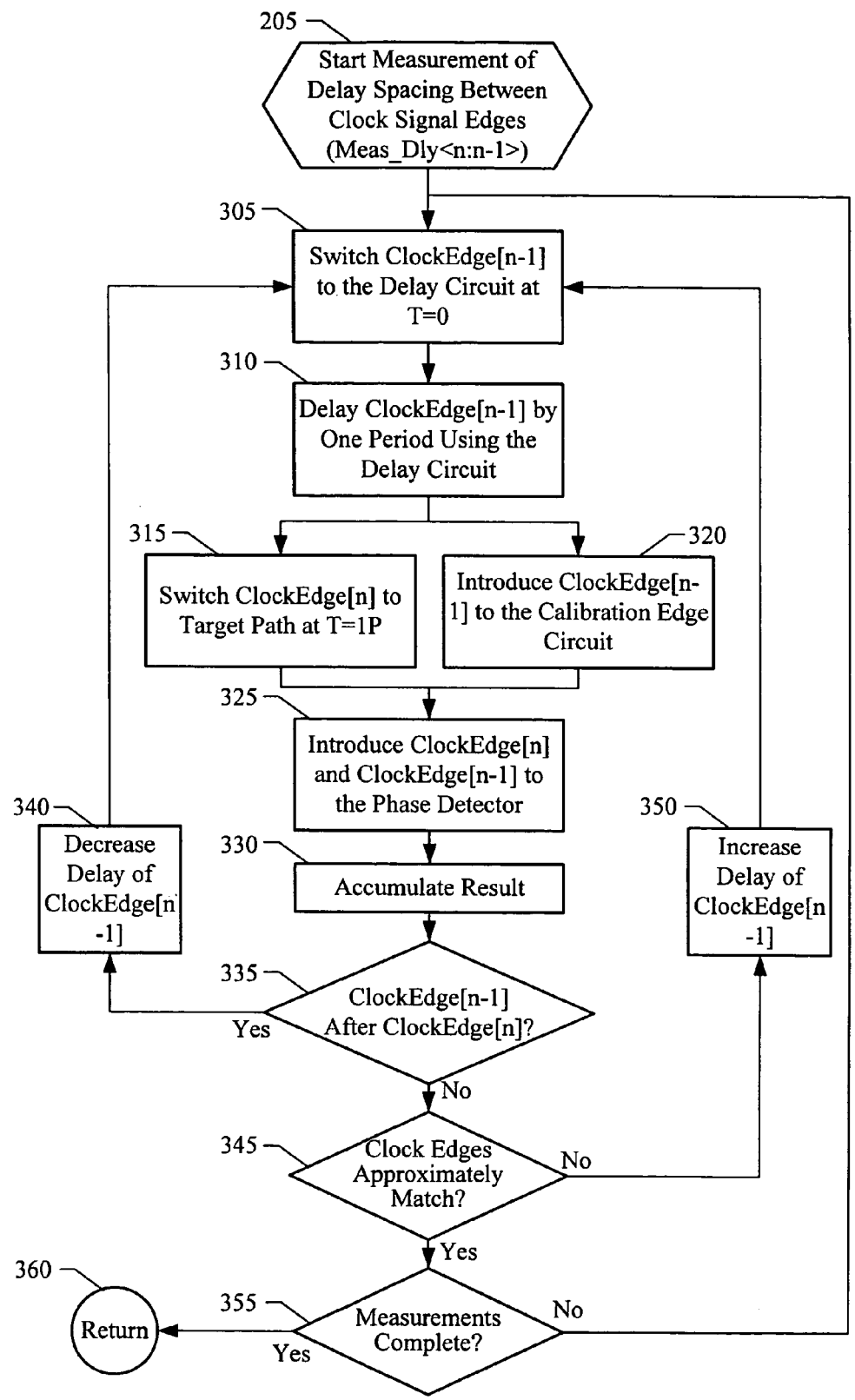
FIG. 3 is a flow diagram of one embodiment of the invention for measuring delay spacing between clock signal edges for the method illustrated in FIG. 2.

FIG. 3 illustrates one embodiment of a method to measure delay spacing between clock signal edges as illustrated in FIG. 2. In a system designed to accept one clock edge at a time from a vernier timing generator, ClockEdge[n−1] is switched (block 305) to a one period delay circuit in a delay path at the beginning of the reference clock period (T=0) for a delay of one period (block 310). ClockEdge[n] is switched to a target path at T=1P and ClockEdge[n−1] is introduced to a calibration edge circuit (blocks 315, 230) to enable a further variable delay. The two clock signal edges, ClockEdge[n] and ClockEdge[n−1], are compared (block 325), preferably with a phase detector. The results of several comparisons are accumulated (block 330) to determine if one edge is in front of the other in time. If the result of the accumulation indicates that ClockEdge[n−1] is after ClockEdge[n] (block 335), the delay of ClockEdge[n−1] is decreased to move it closer to ClockEdge[n] (block 340) by increasing an input bias of the calibration edge circuit (the calibration edge circuit's delay is inversely related to its input bias). Preferably, its associated calibration edge register is incremented to enable switching of the input bias to a higher input voltage. If the accumulation indicates that ClockEdge[n−1] did not arrive first, but that they do not approximately match (block 345), the delay of ClockEdge[n−1] is increased (block 350) by decreasing the input bias. Preferably, associated calibration edge register is decremented to enable switching of the input bias to a lower voltage. The method is repeated with ClockEdge[n−1] and ClockEdge[n] switched to the delay and target paths, respectively, at times T=0 (block 305) and T=1P, respectively, to compare them using the phase detector (blocks 305–330). When the accumulated result (block 330) indicates that the edges arrive at the phase comparator at approximately the same time (block 345), the resulting value of the associated calibration register is used as a relative measurement of delay spacing Meas_Dly[n−1] between ClockEdge[n−1] and ClockEdge[n]. The method then continues with a comparison of ClockEdge[n] and ClockEdge[n+1] to find Meas_Dly[n] and with comparison of all other adjacent clock edges within the one period reference clock signal (block 355) so that all delay spacing measurements are stored in each associated calibration edge register. The delay spacing measurements are then returned to the method of FIG. 2 (block 360) for calculation of the average delay spacing (AVE) (see block 215).

Figure 4:
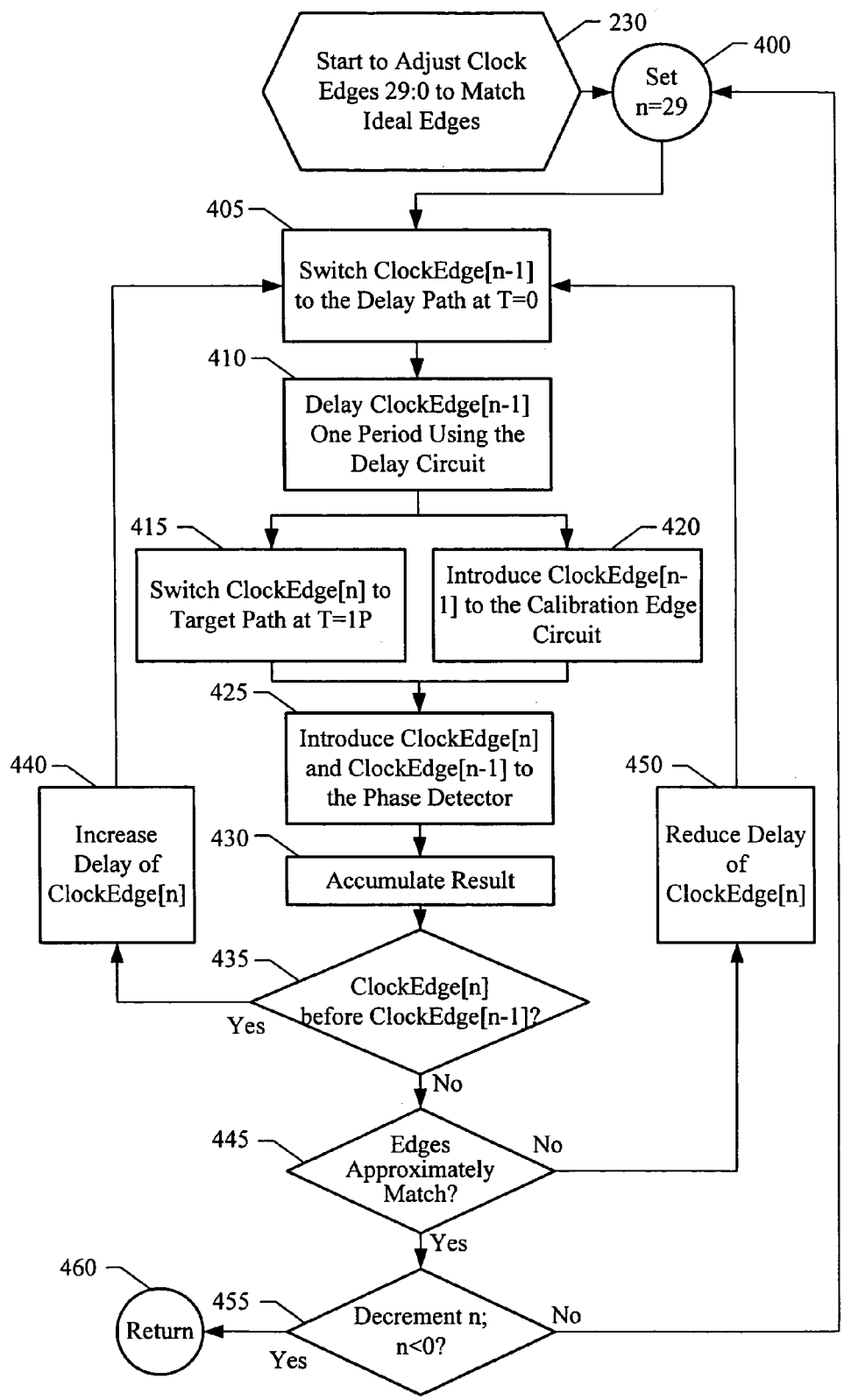
FIG. 4 is a flow diagram of one embodiment of the invention for adjusting clock edges for the method illustrated in FIG. 2.

FIG. 4 is a flow diagram that illustrates one embodiment for adjusting the clock signal edges to match the calculated ideal signal edges, as illustrated in FIG. 2. Although the flow chart illustrates the process for adjusting thirty clock edges, any number of clocks may be used depending on the number of clock edges desired by the designer of the system. With the calibration edge registers previously set for each value of Err_Dly[29:0] (see block 230 in FIG. 2), ClockEdge[28] is switched to the delay path at T=0 (block 405) to be delayed one period (block 410). ClockEdge[29] is switched to the target path and ClockEdge[28] is introduced to the calibration edge circuit, each at T=1P (blocks 415, 420). ClockEdge[28] and ClockEdge[29] are introduced to a phase detector (block 425) to determine which is first in time and the result is accumulated (block 430).

If the result of the accumulation indicates that ClockEdge[29] is before ClockEdge[28] in time (block 435), then ClockEdge[29] is delayed by decrementing its associated vernier calibration register to decrease its delay bias input (block 440). If the accumulated result does not indicate that ClockEdge[29] is before ClockEdge[28] (block 435) and that they do not match (block 445) then the delay for ClockEdge[29] is reduced (block 450) by incrementing its associated vernier calibration register to decrease its delay bias input and the process is repeated to accumulate a new result (blocks 405–430). Otherwise, if the result of the accumulation of the phase detector indicates the edges approximately match (block 445), then the method continues with the next lower clock signal pair (block 455) so that ClockEdge[28] and Clockedge[27] are compared (blocks 400–430) and, sequentially, each other sequential pair until ClockEdge[0] and ClockEdge[1] match (blocks 400–445) and operation returns (block 460) to the method illustrated in FIG. 2. The preceding description assumes that an increase or decrease in delay bias input results in decreased or increased delay, respectively. In another embodiment, an increase or decrease in delay bias input would result in an increased or decreased delay, respectively.

Figure 5A:
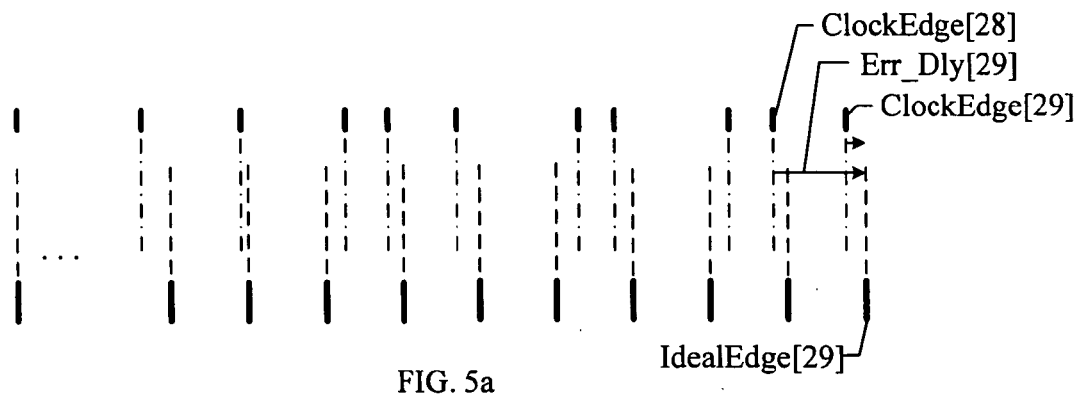
FIGS. 5a–5d are timing diagrams illustrating sequential adjustment of clock signal edges to match the ideal clock signal edges.
Figure 5B:
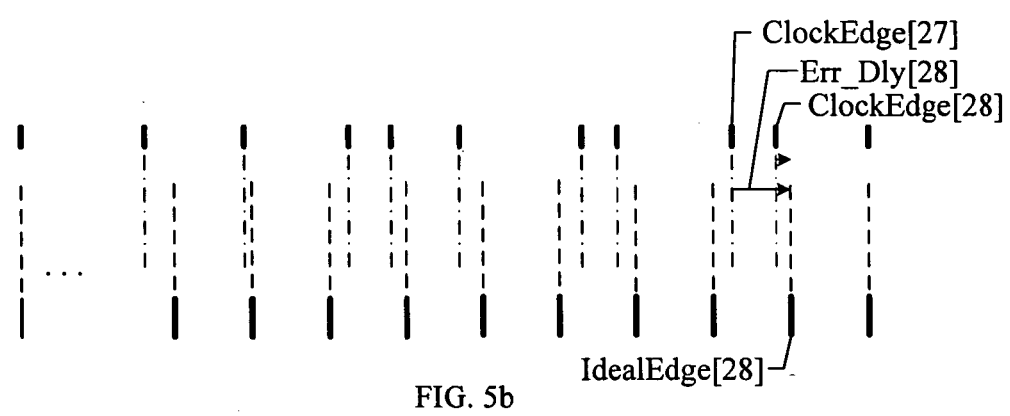
Figure 5C:
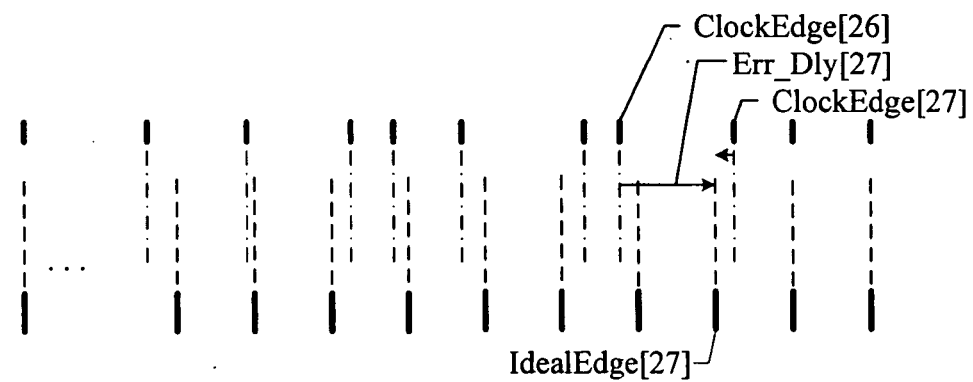
Figure 5D:
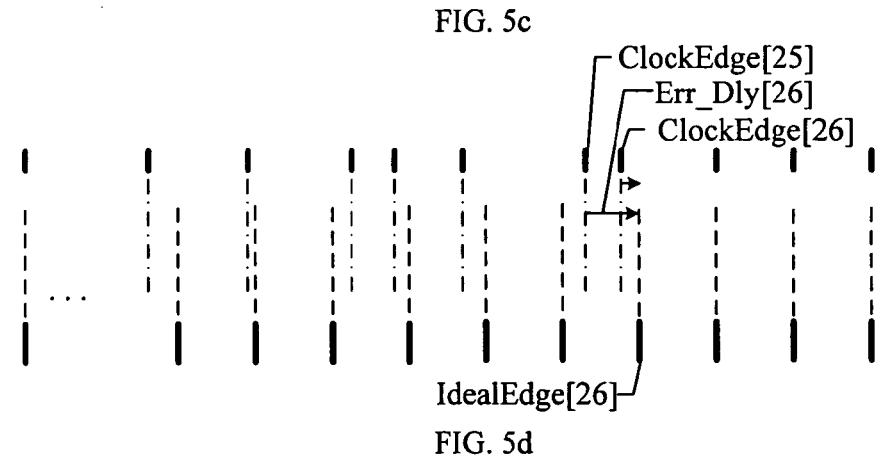

FIGS. 5a through 5d are timing diagrams that illustrate clock signal edges moved sequentially to match respective calculated ideal signal edges. Turning first to FIG. 5a, ClockEdge[28] is delayed, preferably by the one period delay and calibration edge circuits, by the previously measured value of Err_Dly[29] to match the IdealEdge[29]. The ClockEdge[29] is then adjusted to increase or decrease its delay, such as with a decrease or increase, respectively, of an input bias voltage of a variable delay cell, to match ClockEdge[28]. Thus, ClockEdge[29] is calibrated to match IdealEdge[29]. FIG. 5b continues the process with ClockEdge[27] moved by the previously measured value of Err_Dly[28] to match IdealEdge[28]. ClockEdge[28] is then moved to match ClockEdge[27], which is the calculated location of IdealEdge[28], so that ClockEdge[28] is calibrated at the calculated IdealEdge[28] delay location. FIGS. 5c and 5d also illustrate the process for ClockEdge[27] and ClockEdge[26] with Err_Dly[28] and Err_Dly[27], respectively. At the conclusion of the adjustments, ClockEdges [29:0] are calibrated at respective IdealEdge[29:0] locations and either the process stops or another iteration can be performed according to the method illustrated in FIG. 2.

Figure 6:
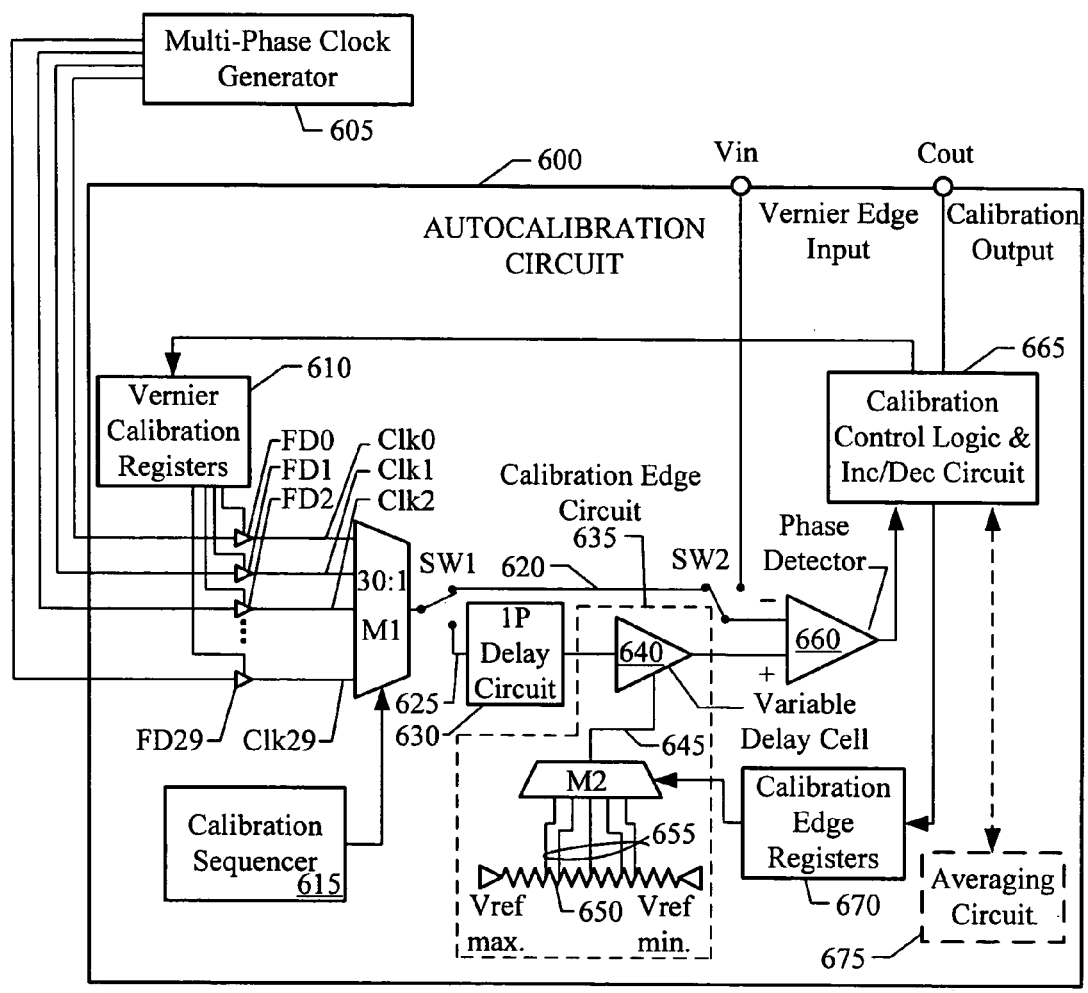
FIG. 6 is a block diagram of one embodiment of the invention that has a calibration edge circuit in an auto calibration circuit to compare clock signal edges.

FIG. 6 is a block diagram of, in one embodiment, an autocalibration circuit that is operable to adjust clock edges from a multi-phase clock generator to match respective calculated ideal clock edges. The multi-phase clock generator 605 drives thirty (30) phase-shifted clock signals on respective signal lines Clk0–Clk29 to a 30:1 MUX ("M1"). Each of the signal lines Clk0–Clk29 can be provided with a variable signal delay using respective variable bias cells FD0–FD29, with the delay bias of each cell controlled by a respective register in vernier calibration registers 610. A calibration sequencer 615 enables M1 to introduce sequential clock edges to switch SW1. As illustrated, SW1 is operable to switch between target and delay signal paths (620, 625) for comparison of clock edges on adjacent signal lines Clk0–Clk29. Preferably, one period and calibration edge circuits (630, 635) are provided in the delay signal path 625. The one period delay circuit 630 is operable to delay an introduced clock signal edge by one clock period. The calibration edge circuit 635 is operable to provide a variable delay, preferably up to a one period variable delay. Or, the one period delay and calibration edge circuits (630, 635) can be combined into one variable delay module to delay a clock signal edge between one and two periods of the reference clock.

The calibration edge circuit 635 includes the variable delay cell 640, a second MUX ("M2"), a delay bias input 645, a resistance string 650 and a plurality of impedance lines 655. More particularly, the variable delay cell 640 accepts a bias voltage from M2 through the delay bias input 645. M2 is operable to select from a predetermined plurality of voltages for use by the variable delay cell 640. M2 is either coupled to an impedance string 650 through the plurality of impedance lines 655, as illustrated, or to another voltage source of variable voltages. If a resistor string is used as the impedance string 650, it is coupled between high and low reference voltages Vref MAX and Vref MIN to provide linearly spaced voltage source to M2. Through appropriate choice of resistor string 650 taps, control of M2 allows predetermined delays of a clock signal edge introduced to the calibration edge circuit 635 from M1. A phase detector 660 is selectively coupled at its inverting input to the target signal path 625 and to a vernier edge input terminal Vin through switch SW2. The phase detector's 660 non-inverting input is coupled to the output of the variable delay cell 645 to compare delay timing of clock signal edges between the target and delay signal paths (620, 625). The result of the comparison, in the form of a high ("HIGH") or low ("LOW") voltage on its output, is presented to a calibration control logic and increment/decrement circuit 665. During operation, the calibration sequencer 615 enables M1 to introduce ClockEdge[1] and ClockEdge[0] from Clk1 and Clk0, respectively, to the delay and target signal paths (625, 620), respectively, for eventual comparison at phase detector 660.

Calibration edge registers 670 are coupled to M2 for switching control of bias input voltages selectively provided to the variable delay cell 640. Terminals Vin and Cout are coupled to SW2 and the calibration control logic & increment/decrement circuit 665, respectively, to enable subsequent calibration of externally generated clock edges.

When the auto calibration circuit 600 is used to measure delay spacing between adjacent signal edges ClockEdge[n] and ClockEdge[n−1] (block 205), then a voltage HIGH signal at the output of the phase detector 660 would indicate that ClockEdge[n−1] precedes ClockEdge[n] through delay and target signal paths, respectively (620, 625). In this case, the calibration control logic and increment/decrement circuit 665 increments the associated calibration edge register 670 by switching M2 to a higher bias voltage at the delay bias input 645 to delay ClockEdge [n−1]. If, however, a LOW signal is indicated at the output of the phase detector 660, then the calibration edge register 670 would be decremented by the calibration control logic and increment/decrement circuit 665 to accomplish a higher delay bias input 650. The calibration control logic and increment/decrement circuit 665 accumulates a plurality of results from the phase detector 660 to determine when clock signal edges on target and delay signal path (620, 625) are approximately equal. When they are approximately equal, the resulting numerical value of the associated calibration edge register 670 is the measurement of delay spacing between the examined clock signal edges (Meas_Dly<n:n−1>). An averaging circuit 675 can be used by the calibration control logic and increment/decrement circuit 665 to reduce measurement errors when to determining if the clock signal edges are approximately in phase.

When adjusting the clock edges to match the ideal delay spacing, the clock edge introduced to the delay path 625 is delayed by a predetermined amount by the calibration edge registers 670, and the vernier calibration registers 610 are incremented or decremented as required for the clock signal edges in the target and delay paths (625, 630) to approximately match.

A vernier-edge input terminal Vin and a calibration-output terminal Cout are also provided with the auto calibration circuit 600, with the terminal Cout coupled to an output of the calibration control logic and increment/decrement circuit 665 to allow calibration of externally provided timing verniers.

Figure 7:
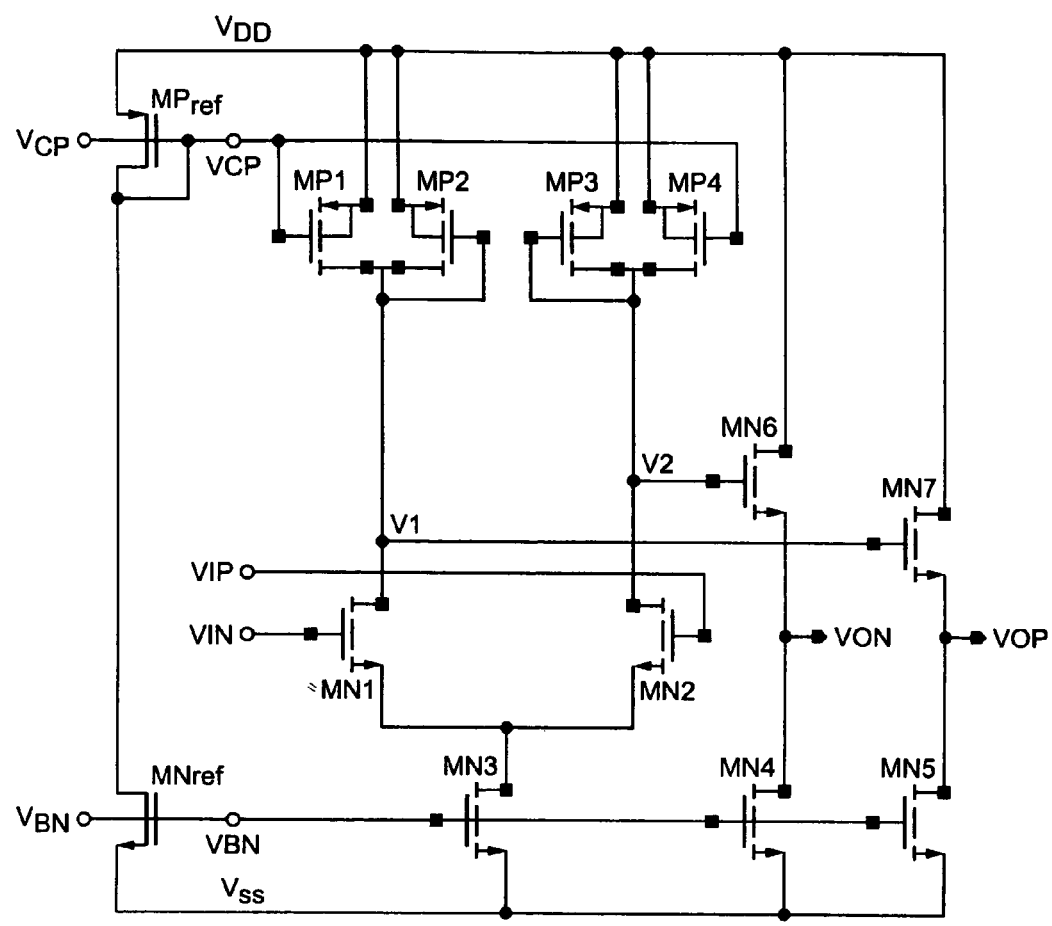
FIG. 7 is a block diagram of one embodiment of the variable delay cell illustrated in FIG. 6.

FIG. 7 is schematic of, in one embodiment, the variable delay cell illustrated in FIG. 6. Although FIG. 6 illustrates a single-ended circuit for simplicity, a differential solution can be readily implemented and is utilized in FIG. 7 to better describe one embodiment of the delay cell. For example, input terminals VIN and VIP are coupled to gates of transistors MN1 and MN2, respectively, which form a differential amplifier. Transistor pairs MP1/MP2 and MP3/MP4 form a load for transistors MN1 and MN2, respectively. More particularly, MP1 is connected as a current source to MN1 to pull the voltage at node V1 up to a voltage VDD for reduced values of current coming out of MN1. MP2 is coupled to transistor MN1 as a voltage limiter at node V1 so that, for large values of current coming out of transistor MN1, MP2 limits how low the voltage at node V1 can drop. Transistor MN6 is coupled to output terminal VON, with transistor MN4 providing its current to transistor MN6. Together, MN6 and MN4 form a source follower buffer. Similarly, transistor MN7 is coupled to output terminal VOP as source follower buffer, with transistor MN5 providing its current to transistor MN7. Transistor MN3 is coupled to MN1 and MN2 as a current source for each. Transistors MPref and MNref are coupled to terminals VCP and VBN, respectively, to provide biasing for transistor pairs MP1/MP4. By varying the voltage at terminal VBN, a varying signal delay is implemented between differential input terminals VIP/VIN and output terminals VOP/VON.

Figure 8:
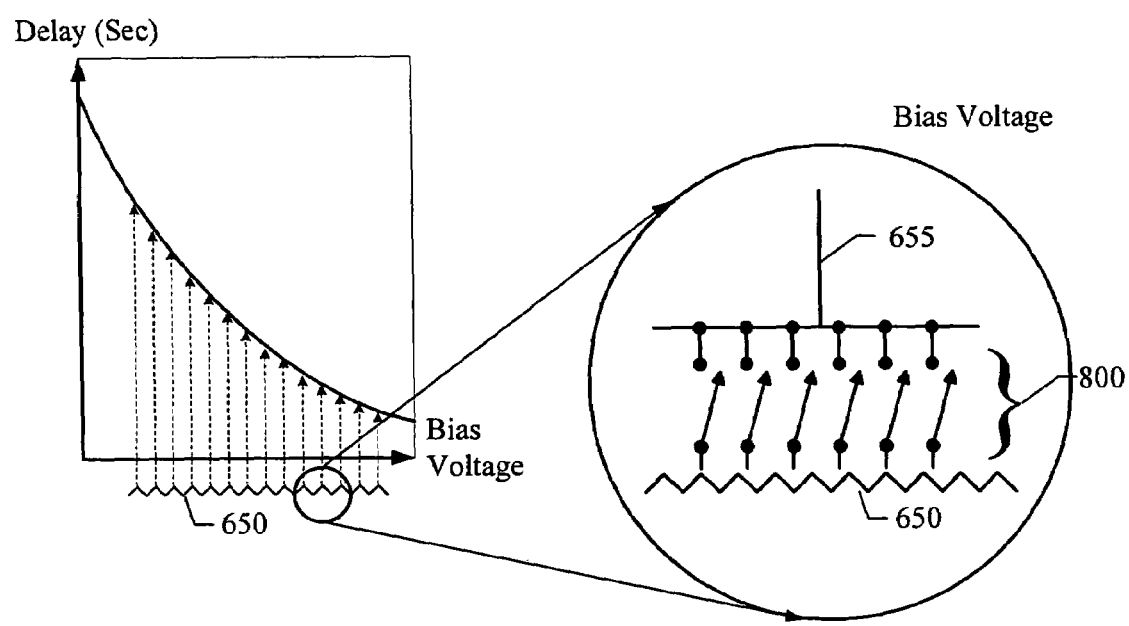
FIG. 8 is a block diagram and schematic of one embodiment of an impedance string in the calibration edge circuit illustrated in FIG. 6.

FIG. 8 is a combined graph and schematic diagram of a resistor string implementation of the impedance string 650 and impedance lines 655. Each of the plurality of impedance lines 655 are coupled to a plurality of bias taps 800 distributed along the length of the impedance string 650. The bias taps 800 supply the bias voltage levels to M2 for supplying the delay bias input 645 with selectable voltage levels. They are either grouped into successive subsets of taps or individually connected to respective impedance lines. As indicated in FIG. 8, the relationship between bias voltage and the resulting delay of the variable delay cell 640 is nonlinear and inverse. In this illustration, the bias taps 800 are equally spaced along the impedance string 650, resulting in a nonlinear sequence of variable delay cell 640 delays. If linear delay increments are desired, the bias taps 800 could be spaced at unequal increments along the string to compensate for the nonlinearity of the voltage-delay curve. The bias taps 800 are distributed along a respective section of the resistor length, and include parallel switches or, alternatively, a switch tree which connect to the taps.

Figure 9:
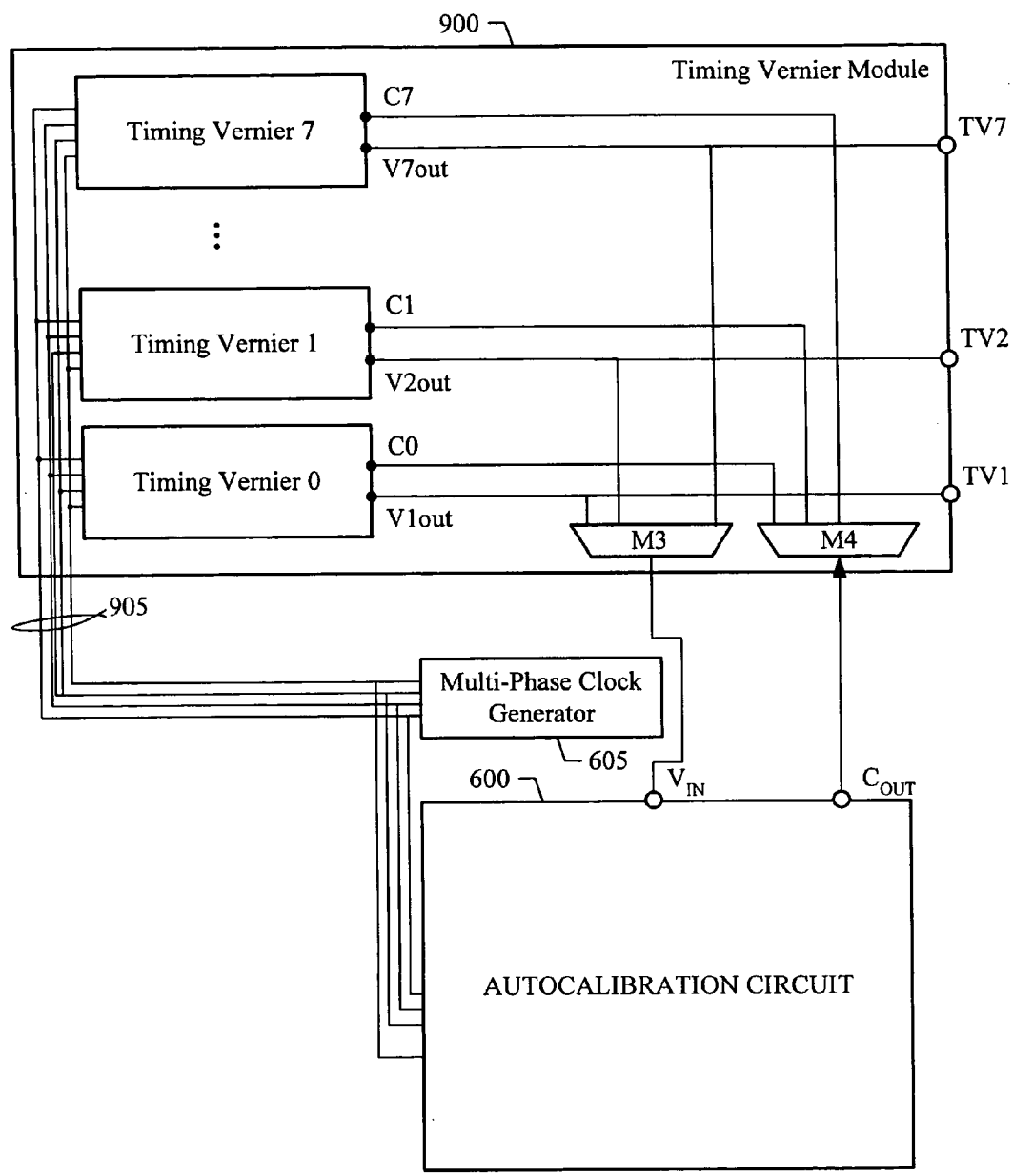
FIG. 9 is a block diagram of a timing vernier circuit coupled to the autocalibration circuit illustrated in FIG. 6.

FIG. 9 illustrates a system for using the auto calibration circuit 600 to calibrate a plurality of timing verniers 0–7 in a timing vernier circuit 900. A timing vernier circuit 900 is coupled to the auto calibration circuit 600 at vernier edge input and calibration output terminals Vin and Cout. Each of the timing verniers 0–7 receive differently phase-delayed clock signals from the multiphase clock generator 605 through timing control lines 905. An output terminal Vnout on each timing vernier 0–7 is coupled to terminal Vin through a third MUX ("M3") to provide the autocalibration circuit 600 with its respective clock signal edge for calibration. Each timing vernier also has an input terminal CN coupled to Cout through a fourth MUX ("M4") to receive feedback from the calibration control logic and increment/decrement circuit 665 in the form of a timing register update. Each timing vernier N in the timing veriner module module 900 is coupled to respective timing vernier module output terminals TV1–TV7. Subsequent to the autocalibration methods illustrated in FIGS. 1–4, and 5a–d, the auto calibration circuit 600 is operable to compare the thirty uncalibrated clock signal edges from each of timing verniers 0–7 to the calibrated clock edges ClockEdge[0:29].

Figure 10:
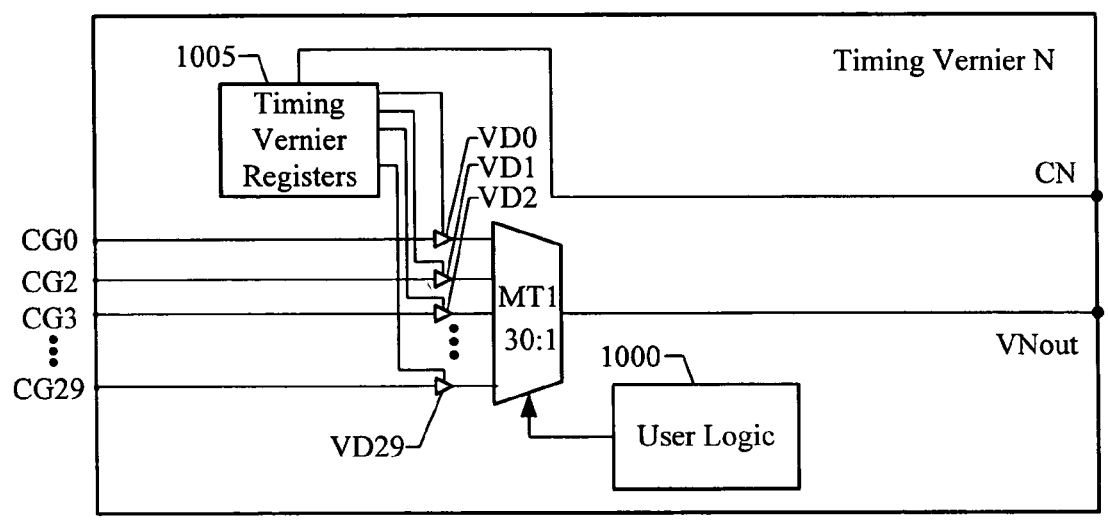
FIG. 10 is a block diagram of one embodiment of a timing vernier in the timing vernier module illustrated in FIG. 9.

FIG. 10 is a block diagram of, in one embodiment, a timing vernier N for use as each of the timing verniers 0–7 illustrated in FIG. 9. User logic 1000 is coupled to a timing vernier 30:1 MUX ("MT1") to selectively switch one of a plurality of clock edges to output terminal TNout. MT1 is coupled to input terminals CG0–CG29 to receive uncalibrated clock edges from the multi-phase clock generator 605 illustrated in FIG. 9. Timing vernier registers 1005 are coupled to respective variable delay cells VD0–VD29 to enable a selective delay of each respective clock edge prior to switching to terminal TN through MT1. Preferably, each of VD0–VD29 includes a MUX that is operable to select from a plurality of voltages based on input from the timing vernier registers 1005. Terminal CN is coupled to the timing vernier registers 1005 to receive the timing register update signal from the autocalibration circuit 600 (FIG. 6).

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

What is claimed is:

1. A method of autocalibrating a plurality of phase-delayed clock signal edges, comprising:
   measuring delay spacings between said plurality of clock signal edges within a reference clock period;
   calculating desired delay spacings from said delay spacings;
   calculating ideal signal edges from said desired delay spacings; and
   adjusting said clock signal edges to match said respective ideal signal edges;
   wherein said plurality of clock signal edges are selectively available.

2. The method of claim 1, further comprising:
   measuring a wrap-around delay spacing between the last and first signal edges of said plurality of clock signal edges to reduce error in said calculation of desired delay spacing.

3. The method of claim 1, wherein said desired delay spacings are calculated by:
   calculating an average delay spacing so that the calibrated clock signal edges form an approximately linear time reference.

4. The method of claim 1, wherein, for each successive pair of clock signal edges in said plurality of clock signal edge, said delay spacings are measured by:
   comparing the first and second clock signal edges to determine which arrives first.

5. The method of claim 1, wherein, for each successive pair of clock signal edges in said plurality of clock signal edges, said delay spacings are measured by:
   switching first and second clock signal edges of said plurality of clock signal edges to target and delay signal paths, respectively; and
   comparing the phases of said first and second clock signal edges.

6. The method of claim 1, wherein, for each successive pair of clock signal edges in said plurality of clock signal edges, said delay spacings are measured by:
   delaying a first clock signal edge of said plurality of clock signal edges by one period with a one period delay circuit; and
   comparing the phases of said first clock signal edge to the phase of a second clock signal edge of said plurality of clock signal edges.

7. The method of claim 1, wherein said delay spacings are measured by:
   delaying a first clock signal edge of said plurality of clock signal edges to determine said delay spacing.

8. The method of claim 1, wherein, for each successive pair of clock signal edges in said plurality of clock signal edges, said delay spacings are measured by:

adjusting a first clock signal to match a second clock signal edge, each of said first and second clock signals of said plurality of clock signal edges; and determining said delay spacings from said adjustment.

9. The method of claim 1, wherein, for each successive pair of clock signal edges in said plurality of clock signal edges, said delay spacings are measured by:

incrementing a calibration control register to induce a change in delay of a first clock edge to match a delay of a second clock edge, said first and second clock edges of said plurality of clock signal edges; and taking the resulting value of the calibration control register as the delay spacing measurement.

10. The method of claim 1, wherein, for each successive pair of clock signal edges in said plurality of clock signal edges, said delay spacings are measured by:

decrementing a calibration control register to induce a change in delay of a first clock edge to match a delay of a second clock edge, said first and second clock edges of said plurality of clock signal edges; and taking the resulting value of the calibration control register as the delay spacing.

11. The method of claim 1, further comprising:

calculating error delays between said clock signal edges and respective next ideal signal edges to enable said adjusting of said clock signals based on said calculated error delays.

12. The method of claim 11, further comprising:

saving said error delays for subsequent retrieval.

* * * * *